(12) United States Patent
Nam et al.

(10) Patent No.: US 6,597,160 B2
(45) Date of Patent: Jul. 22, 2003

(54) METHOD FOR MEASURING FUNDAMENTAL FREQUENCY COMPONENT OF FAULT CURRENT OR VOLTAGE SIGNAL

(75) Inventors: Soon yeol Nam, Seoul (KR); Sang Hee Kang, Seoul (KR); Jong Keun Park, Seoul (KR)

(73) Assignee: Myongji University, Seoul (KR)

( * ) Notice: Subject to any disclaimer, the term of this patent is extended or adjusted under 35 U.S.C. 154(b) by 0 days.

(21) Appl. No.: 10/082,090

(22) Filed: Feb. 26, 2002

(65) Prior Publication Data

US 2003/0094936 A1 May 22, 2003

(30) Foreign Application Priority Data

Oct. 9, 2001 (KR) .................................... 2001-0062118

(51) Int. Cl.[7] ........................ G01R 23/00; G01R 23/165
(52) U.S. Cl. .................................. 324/76.19; 324/76.29
(58) Field of Search .......................... 324/76.19, 76.29, 324/76.22; 702/75, 76, 106, 190

(56) References Cited

U.S. PATENT DOCUMENTS

| | | | | |
|---|---|---|---|---|
| 5,578,931 A | * | 11/1996 | Russell et al. | 324/536 |
| 5,798,932 A | * | 8/1998 | Premerlani et al. | 364/483 |
| 6,075,350 A | * | 6/2000 | Peng | 323/207 |

* cited by examiner

Primary Examiner—Jay Patidar
(74) Attorney, Agent, or Firm—Macobson Holman PLLC

(57) ABSTRACT

A method for measuring the fundamental frequency component of a fault current or voltage, including measuring a fault current or voltage signal, which includes a DC-offset, a characteristic frequency component, a fundamental frequency component, and harmonics, with a predetermined sampling period, filtering the fault current or voltage signal to remove the harmonics, removing the fundamental frequency component from the filtered fault current or voltage signal, calculating the DC-offset and the characteristic frequency component with the fault current fault current or voltage signal wherein the fundamental frequency component is removed, and determining the fundamental frequency component by subtracting the calculated DC-offset and the characteristic frequency component from the filtered fault current or voltage signal.

4 Claims, 6 Drawing Sheets

METHOD FOR MEASURING FUNDAMENTAL FREQUENCY COMPONENT OF FAULT CURRENT OR VOLTAGE SIGNAL

BACKGROUND OF THE INVENTION 1. (a) Field of the Invention

The present invention relates to a method for measuring fundamental frequency component of a fault current or voltage signal, particularly, to a signal processing method for extracting accurate fundamental frequency component from a fault current or voltage signal distorted with a DC-offset, a characteristic frequency component and harmonics, in a relaying apparatus to protect the power system.

2. (b) Description of the Related Art

Distance relays are based on the principles of extracting the fundamental frequency components from voltage and current relaying signals. To extract these components, the prior art has used orthogonal transforms such as Fourier transform. However, in actual fault current or voltage signals, there exist time-varying components, such as a DC-offset, resulting in an error. Thus, these components should be taken into consideration to measure the fundamental frequency component of the fault current or voltage signal accurately.

The prior art has suggested methods for measuring the fundamental frequency components by assuming a specific time constant for the DC-offset. However, this time constant depends on the power system configuration at the moment of a fault and also on the location of the fault. These techniques are prone to produce errors if the time constant of a relaying signal is different from the assumed one. To overcome this drawback, J. C. Gu and S. L. Yu proposes a Fourier filter algorithm (J. C. Gu and S. L. Yu, Removal of DC-offset in current and voltage signals using a novel Fourier filter algorithm, IEEE Trans. Power Delivery, vol. 15, No. 1, January 2000, pp. 73–79), which calculates the DC-offset and then measures the accurate fundamental frequency component by compensating the output of the Fourier filter with the calculated DC-offset. Although this method can measure the fundamental frequency component regardless of the time constant of the DC-offset, it also produces errors when the fault current or voltage signal includes any damped high frequency component.

Whenever a fault occurs on a transmission line, damped resonance frequency components are generated. In the present invention, a characteristic frequency component is defined as the damped component with the lowest resonance frequency. The characteristic frequency component is only taken into consideration because the other resonance frequency components not only have much smaller amplitude than the characteristic frequency component, but also can be almost completely eliminated by a low-pass filter.

Generally, the longer a fault distance is, the lower a characteristic frequency becomes. When a fault occurs at a short distance from a relaying point, the characteristic frequency is so high that a low-pass filter used for anti-aliasing can almost completely attenuate the characteristic frequency component. On the other hand, when a fault occurs at a long distance from a relaying point on a long transmission line, the characteristic frequency is not so high compared to the cutoff frequency of the low-pass filter. Accordingly, the characteristic frequency component is insufficiently attenuated by the low-pass filter and has an adverse influence on the measurement of the fundamental frequency component.

Therefore, in addition to the DC-offset, the characteristic frequency component should be taken into consideration when measuring the fundamental frequency component by using orthogonal transforms or other techniques.

SUMMARY OF THE INVENTION

It is an object of the present invention to provide a method for measuring the fundamental frequency component of a fault current or voltage signal distorted with the DC-offset, the characteristic frequency component and harmonics in a protective relaying system.

To achieve the above objective, a method for measuring the fundamental frequency component of a fault current or voltage, comprises the steps of:

measuring a fault current or voltage signal, which includes a DC-offset, a characteristic frequency component, a fundamental frequency component, and harmonics, with a predetermined sampling period (S10);

filtering the fault current or voltage signal to remove the harmonics(S20);

removing the fundamental frequency component from the filtered fault current or voltage signal(S30);

calculating the DC-offset and the characteristic frequency component with the fault current or voltage signal wherein the fundamental frequency component is removed(S40); and determining the fundamental frequency component by subtracting the calculated DC-offset and characteristic frequency component from the filtered fault current or voltage signal.

In the step of filtering the fault current or voltage signal to remove the harmonics, the sine filter is preferably used.

In the step of removing the fundamental frequency component, the linear filter is preferably used.

In the step of calculating the DC-offset and the characteristic frequency component, Prony's method is preferably used.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventors of carrying out the invention. As will be realized, the invention is capable of modification in various obvious respects, all without departing from the invention. Accordingly, the drawings and description are to be regarded as illustrative in nature, and not restrictive.

It is assumed that a fault occurs at a time origin and that the fault current signal consists of a DC-offset, a characteristic frequency component, a fundamental frequency component, and harmonics. On this assumption, the discretized fault current is expressed as $$f_n = A z_0^n + B z_{ch}^n \cos(\omega_{ch} \cdot n\Delta t + \theta_{ch}) + \quad (1)$$
$$C\cos(\omega \cdot n\Delta t + \theta_1) + \sum_{m=2} D_m \cos(m\omega \cdot n\Delta t + \theta_m)$$

where $$z_0 = e^{-\lambda_0 \Delta t}, \quad z_{ch} = e^{-\lambda_{ch}\Delta t}, \quad \Delta t = \frac{2\pi}{\omega}\frac{1}{N}, \quad \lambda_0 = \frac{1}{\tau_0}, \quad \lambda_{ch} = \frac{1}{\tau_{ch}},$$

$\omega_{ch}$ = characteristic angular frequency, $\omega$ = fundamental angularfrequency, $\tau_0$ = time constant of DC-offset, $\tau_{ch}$ = time constant of the characteristic frequency component, $N$ = number of samples per fundamental cycle.

Figure 1:
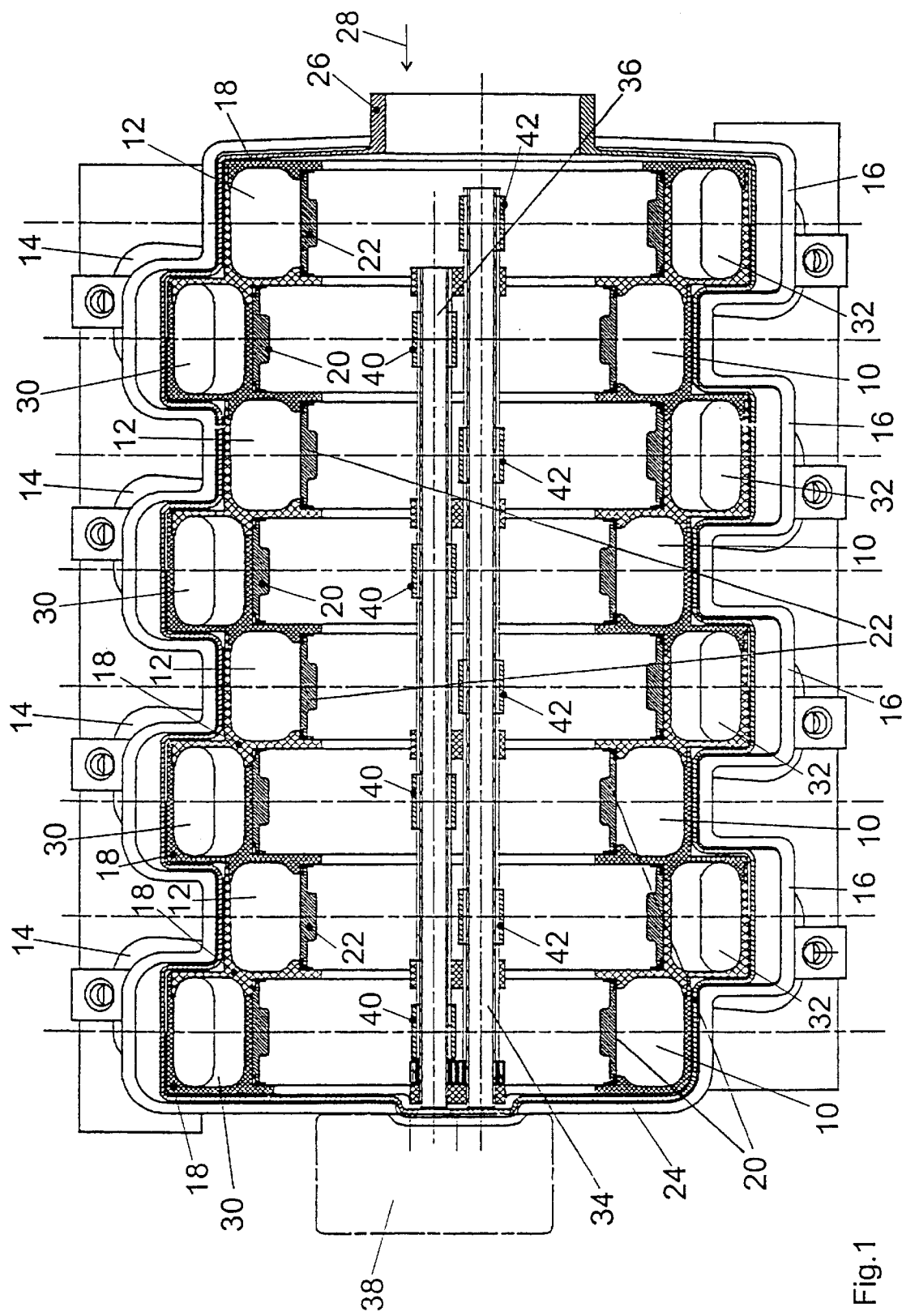
FIG. 1 is a flow chart of a method for measuring the fundamental frequency component of a fault current or voltage, according to one embodiment of the present invention.

FIG. 1 is a flow chart of a method for measuring the fundamental frequency component of a fault current or voltage, according to one embodiment of the present invention.

Figure 2:
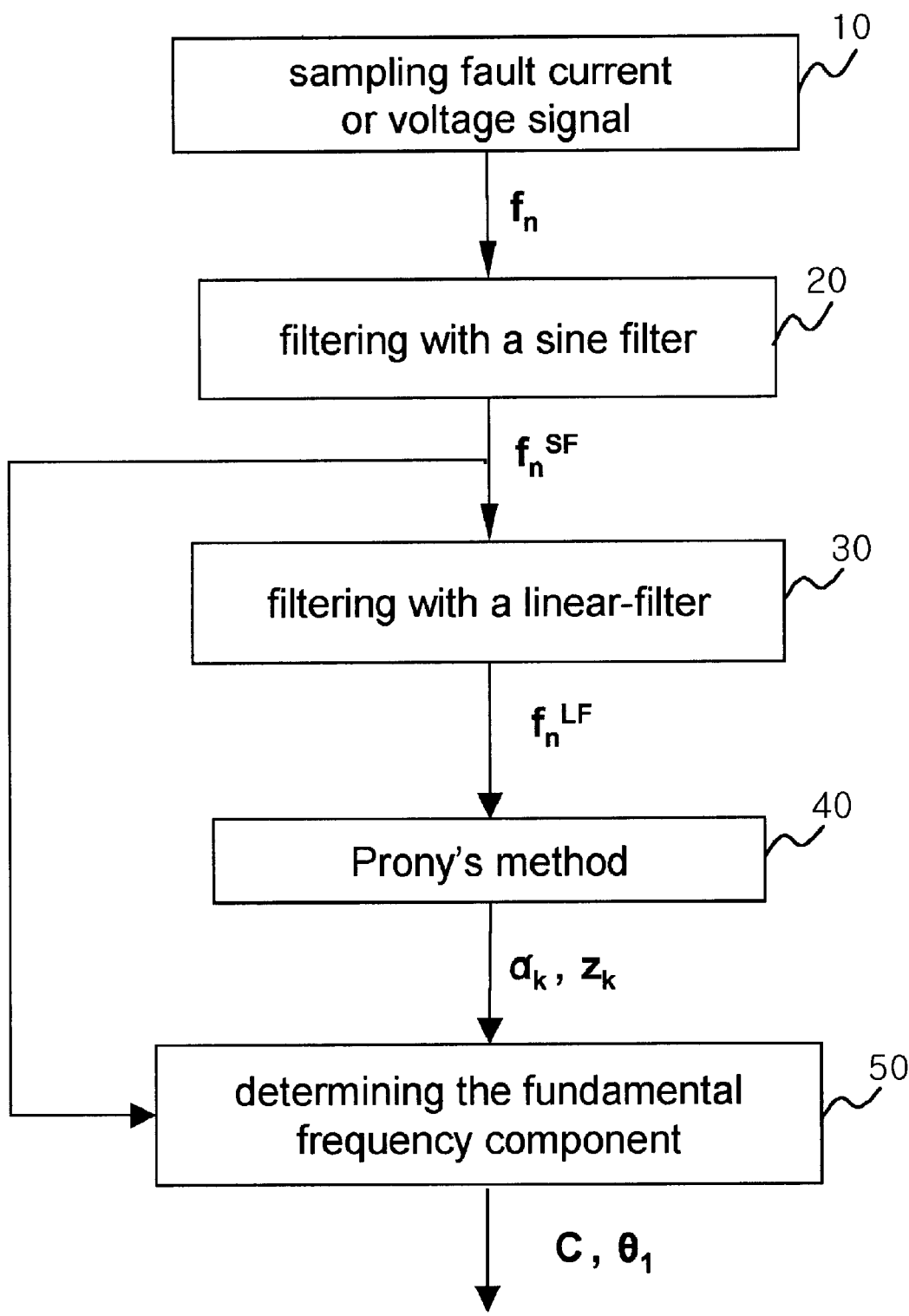
FIG. 2 shows an exemplary embodiment of the present invention.

FIG. 2 shows a flow of process and data in an exemplary embodiment of the present invention.

The final goal of the present embodiment is to estimate the amplitude C and the phase $\theta_1$ of the fundamental frequency component accurately. The sine filter 20 and the linear filter 30 eliminate respectively the harmonics and the fundamental frequency component from the fault current or voltage signal. Then Prony's method 40 is used to estimate the parameters of the DC-offset and the characteristic frequency component. Finally, the fundamental frequency component is measured by compensating the sine-filtered signal with the estimated parameters.

If Prony's method is directly applied to the sine-filtered signal, too heavy computational burden is laid on a microprocessor and thus it is impossible to perform the proposed method in real time. In order to reduce this burden, the linear filter is applied prior to Prony's method.

The sine filter is used to attenuate the damped resonance frequency components as well as to eliminate harmonics; the sine filter rejects the damped resonance frequency components better than the cosine filter that is generally used by the prior art.

For the discretized fault current or voltage f, the sine-filtered signal $f^{SF}$ is given by the expression $$f_n^{SF} = -\frac{2}{N}\sum_{k=1}^{N} f_{n+k-N} \cdot \sin(\omega \cdot k\Delta t) \quad (2)$$

Substituting f of (1) into (2) yields $$f_n^{SF} = x_0 z_0^n + x_1 z_{ch}^n \cos(\omega_{ch} n\Delta t) + \quad (3)$$
$$x_2 z_{ch}^n \sin(\omega_{ch} n\Delta t) + x_3 \cos(\omega n\Delta t) + x_4 \sin(\omega n\Delta t)$$

where $$x_0 = -\frac{2A}{N}\sum_{k=1}^{N} z_0^{k-N}\sin(\omega k\Delta t),$$

$$x_1 = -\frac{2B}{N}\sum_{k=1}^{N} z_{ch}^{k-N}\cos(\omega_{ch}(k-N)\Delta t + \theta_{ch})\sin(\omega k\Delta t),$$

$$x_2 = \frac{2B}{N}\sum_{k=1}^{N} z_{ch}^{k-N}\sin(\omega_{ch}(k-N)\Delta t + \theta_{ch})\sin(\omega k\Delta t),$$

$$x_3 = C\sin(\theta_1),$$

$$x_4 = C\cos(\theta_1).$$

The sine filter removes the harmonics from f.

The linear filter is used to remove the fundamental frequency component from the sine-filtered signal $f^{SF}$. As shown in (3), the sine-filtered signal is composed of three components: DC-offset component ($x_0$), a characteristic frequency component ($x_1$, $x_2$), and a fundamental frequency component ($x_3$, $x_4$).

After manipulating three successive samples of $f^{SF}$, the fundamental frequency component can be removed from $f^{SF}$, as shown by the equation $$f_n^{LF} = \sum_{k=0}^{2} c_k f_{n+k-2}^{SF} \quad (4)$$

where $c_0 = \cos(\omega 1\Delta t)\sin(\omega 2\Delta t) - \sin(\omega 1\Delta t)\cos(\omega 2\Delta t),$ $c_1 = \sin(\omega 0\Delta t)\cos(\omega 2\Delta t) - \cos(\omega 0\Delta t)\sin(\omega 2\Delta t),$ $c_2 = \cos(\omega 0\Delta t)\sin(\omega 1\Delta t) - \sin(\omega 0\Delta t)\cos(\omega 1\Delta t),$ The linear-filtered signal $f^{LF}$ is generally expressed as $$f_n^{LF} = d_0 x_0 z_0^n + (d_1 x_1 + d_2 x_2) z_{ch}^n \cos(\omega_{ch} n\Delta t) + \quad (5)$$
$$(d_1 x_2 - d_2 x_1) z_{ch}^n \sin(\omega_{ch} n\Delta t)$$

where $$d_0 = \sum_{k=0}^{2} c_k z_0^{k-2},$$

$$d_1 = \sum_{k=0}^{2} c_k z_{ch}^{k-2}\cos(\omega_{ch}(k-2)\Delta t),$$

$$d_2 = \sum_{k=0}^{2} c_k z_{ch}^{k-2}\sin(\omega_{ch}(k-2)\Delta t).$$

As shown in (5), the linear-filtered signal $f^{LF}$ is composed of the DC offset and the characteristic frequency component.

Prony's method (J. F. Hauer, C. J. Demeure, and L. L. Scharf, "Initial results in Prony analysis of power system response signals," IEEE Trans Power Systems, Vol. 5, No. 1, February 1990, pp. 80–89; . Chaari, P. Bastard, and M. Meunier, "Prony's method: an efficient tool for the analysis of earth fault currents in Petersen-coil-protected networks," IEEE Trans. Power Delivery, vol. 10, No. 3, July 1995, pp. 1234–1241.) is widely used for analyzing a fault current or voltage signal.

Although Prony's method can directly estimate the frequency, time constant, amplitude, and relative phase of modal components, it is nearly impossible to perform this method in real time on a microprocessor. The reason is that Prony's method should solve an algebraic equation with the same order as the number of modal components concerned. DC-offset has one modal component and every frequency component has two modal components. Therefore, the sine-filtered signal $f^{SF}$ has five modal components and thus Prony's method must solve a fifth order algebraic; however, the computational burden is still too heavy. In order to reduce the number of modal components, the linear filter is applied prior to Prony's method, which removes the fundamental frequency component from $f^{SF}$. As a result, Prony's method has only to solve a third order algebraic equation when applied to the linear-filtered signal that has three modal components.

According to Prony's method, the linear-filtered signal $f^{LF}$ can be expressed as $$f_n^{LF} = \sum_{k=0}^{2} a_k (z_k)^n \quad (6)$$

where $$z_0 = e^{-\lambda_0 \Delta t}, \ z_1 = e^{(-\lambda_{ch} + j\omega_{ch})\Delta t}, \ z_2 = e^{(-\lambda_{ch} - j\omega_{ch})\Delta t}$$

The purpose of Prony's method is to estimate the values of $a_k$ and $z_k$. The four successive samples of $f^{LF}$ form the following equation:

$$\begin{bmatrix} f_0^{LF} \\ f_1^{LF} \\ f_2^{LF} \\ f_3^{LF} \end{bmatrix} = \begin{bmatrix} z_0^0 & z_1^0 & z_2^0 \\ z_0^1 & z_1^1 & z_2^1 \\ z_0^2 & z_1^2 & z_2^2 \\ z_0^3 & z_1^3 & z_2^3 \end{bmatrix} \begin{bmatrix} a_0 \\ a_1 \\ a_2 \end{bmatrix} \quad (7)$$

The $z_k$ are necessarily the solutions of a three-order algebraic equation with unknown coefficients $e_k$ and thus satisfy $$e_0 \cdot z_k^0 + e_1 \cdot z_k^1 + e_2 \cdot z_k^2 - z_k^3 = 0 \quad (8)$$

The application of the coefficients $e_k$ to (7) forms $$\begin{bmatrix} e_0 \\ e_1 \\ e_2 \\ -1 \end{bmatrix}^T \begin{bmatrix} f_0^{LF} \\ f_1^{LF} \\ f_2^{LF} \\ f_3^{LF} \end{bmatrix} = \begin{bmatrix} e_0 \\ e_1 \\ e_2 \\ -1 \end{bmatrix}^T \begin{bmatrix} z_0^0 & z_1^0 & z_2^0 \\ z_0^1 & z_1^1 & z_2^1 \\ z_0^2 & z_1^2 & z_2^2 \\ z_0^3 & z_1^3 & z_2^3 \end{bmatrix} \begin{bmatrix} a_0 \\ a_1 \\ a_2 \end{bmatrix} \quad (9)$$

Some minor calculations give the following equation:

$$e_0 f_0^{LF} + e_1 f_1^{LF} + e_2 f_2^{LF} - f_3^{LF} = \begin{bmatrix} e_0 z_0^0 + e_1 z_0^1 + e_2 z_0^2 - z_0^3 \\ e_0 z_1^0 + e_1 z_1^1 + e_2 z_1^2 - z_1^3 \\ e_0 z_2^0 + e_1 z_2^1 + e_2 z_2^2 - z_2^3 \end{bmatrix}^T \begin{bmatrix} a_0 \\ a_1 \\ a_2 \end{bmatrix} = \begin{bmatrix} 0 \\ 0 \\ 0 \end{bmatrix}^T \begin{bmatrix} a_0 \\ a_1 \\ a_2 \end{bmatrix} = 0 \quad (10)$$

where the last step results from (8). Three successive equations obtained by similar calculations form $$\begin{bmatrix} f_0^{LF} & f_1^{LF} & f_2^{LF} \\ f_1^{LF} & f_2^{LF} & f_3^{LF} \\ f_2^{LF} & f_3^{LF} & f_4^{LF} \end{bmatrix} \begin{bmatrix} e_0 \\ e_1 \\ e_2 \end{bmatrix} = \begin{bmatrix} f_3^{LF} \\ f_4^{LF} \\ f_5^{LF} \end{bmatrix} \quad (11)$$

Consequently, the coefficients $e_k$ are obtained from $$\begin{bmatrix} e_0 \\ e_1 \\ e_2 \end{bmatrix} = \begin{bmatrix} f_0^{LF} & f_1^{LF} & f_2^{LF} \\ f_1^{LF} & f_2^{LF} & f_3^{LF} \\ f_2^{LF} & f_3^{LF} & f_4^{LF} \end{bmatrix}^{-1} \begin{bmatrix} f_3^{LF} \\ f_4^{LF} \\ f_5^{LF} \end{bmatrix} \quad (12)$$

With the obtained coefficients $e_k$, the three solutions of (8) are given by $$z_0 = \frac{e_2}{3} - \frac{R}{3} \frac{\sqrt[3]{2}}{T} + \frac{T}{3\sqrt[3]{2}} \quad (13)$$

$$z_1 = \left( \frac{e_2}{3} + \frac{R}{6} \frac{\sqrt[3]{2}}{T} - \frac{\sqrt[3]{4T}}{12} \right) + j \left( \frac{R}{\sqrt[3]{4} \sqrt{3T}} + \frac{\sqrt[3]{4T}}{4\sqrt{3}} \right)$$

$$z_2 = \left( \frac{e_2}{3} + \frac{R}{6} \frac{\sqrt[3]{2}}{T} - \frac{\sqrt[3]{4T}}{12} \right) - j \left( \frac{R}{\sqrt[3]{4} \sqrt{3T}} + \frac{\sqrt[3]{4T}}{4\sqrt{3}} \right)$$

where $$R = -e_2^2 - 3e_1,$$

$$S = 2e_2^3 + 9e_2 e_1 + 27 e_0,$$

$$T = \sqrt[3]{\left( S + \sqrt{4R^3 + S^2} \right)}.$$

Substituting the $z_k$ of (13) into (7) yields $$\begin{bmatrix} a_0 \\ a_1 \\ a_2 \end{bmatrix} = \begin{bmatrix} z_0^0 & z_1^0 & z_2^0 \\ z_0^1 & z_1^1 & z_2^1 \\ z_0^2 & z_1^2 & z_2^2 \end{bmatrix}^{-1} \begin{bmatrix} f_0^{LF} \\ f_1^{LF} \\ f_2^{LF} \end{bmatrix} \quad (14)$$

Therefore, Prony's method can estimate the parameters of the modal components with (13) and (14). For this estimation, it uses 6 samples from $$f_n^{LF}$$

to to $f_{n+5}^{LF}$.

The estimated modal components are related to the components of $f^{LF}$, which is expressed as (5), by $$z_0 = e^{-\lambda_0 \Delta t}, \quad z_1 = e^{(-\lambda_{ch} + j\omega_{ch})\Delta t}, \quad z_2 = e^{(-\lambda_{ch} - j\omega_{ch})\Delta t} \quad (15)$$

$$a_0 \cdot (z_0)^n = d_0 \cdot x_0 \cdot z_0^n \quad (16)$$

$$a_1 z_1^n + a_2 z_2^n = a_1 \cdot z_1^n + \overline{a}_1 \cdot \overline{z}_1^n \quad (17)$$

$$= (d_1 x_1 + d_2 x_2) z_{ch}^n \cos(\omega_{ch} n \Delta t) +$$

$$(d_1 x_2 - d_2 x_1) z_{ch}^n \sin(\omega_{ch} n \Delta t)$$

It should be noted that (15) gives the values of $\lambda_0$, $\lambda_{ch}$ and $\omega_{ch}$. Equation (16) yields $$x_0 = \frac{a_0}{d_0} = \frac{a_0}{\sum_{k=0}^{2} c_k z_0^k} \quad (18)$$

Similarly, (17) yields $$a_1 + a_2 = d_1 x_1 + d_2 x_2 \quad (19)$$

$$a_1 z_1 + a_2 z_2 = (d_1 x_1 + d_2 x_2) z_{ch} \cos(\omega_{ch} 1 \Delta t) + (d_1 x_2 - d_2 x_1) z_{ch} \sin(\omega_{ch} 1 \Delta t) = g_1 x_1 + g_2 x_2 \quad (20)$$

where $$g_1 = d_1 z_{ch} \cos(\omega_{ch} \Delta t) - d_2 z_{ch} \sin(\omega_{ch} \Delta t),$$

$$g_2 = d_2 z_{ch} \cos(\omega_{ch} \Delta t) + d_1 z_{ch} \sin(\omega_{ch} \Delta t).$$

The combination of (19) and (20) determines the values of $x_1$ and $x_2$ as shown in the equation $$\begin{bmatrix} x_1 \\ x_2 \end{bmatrix} = \begin{bmatrix} d_1 & d_2 \\ g_1 & g_2 \end{bmatrix}^{-1} \begin{bmatrix} a_1 + a_2 \\ a_1 z_1 + a_2 z_2 \end{bmatrix} \quad (21)$$

By using the obtained parameters, two successive samples of $f^{SF}$, which is expressed as (3), form $$\begin{bmatrix} x_3 \\ x_4 \end{bmatrix} = \begin{bmatrix} \cos(\omega 0 \Delta t) & \sin(\omega 0 \Delta t) \\ \cos(\omega 1 \Delta t) & \sin(\omega 1 \Delta t) \end{bmatrix}^{-1} \begin{bmatrix} h_0 \\ h_1 \end{bmatrix} \quad (22)$$

where $$h_0 = f_0^{SF} - x_0 z_0^0 - x_1 z_{ch}^0 \cos(\omega_{ch} 0 \Delta t) - x_2 z_{ch}^0 \sin(\omega_{ch} 0 \Delta t),$$

$$h_1 = f_1^{SF} - x_0 z_0^1 - x_1 z_{ch}^1 \cos(\omega_{ch} 1 \Delta t) - x_2 z_{ch}^1 \sin(\omega_{ch} 1 \Delta t).$$

Finally, the parameters of the fundamental frequency component can be obtained from $$C = \sqrt{x_3^2 + x_4^2}, \quad (23\text{-}a)$$

$$\theta_1 = \tan^{-1}\left(\frac{x_3}{x_4}\right) \quad (23\text{-}b)$$

Figure 3:
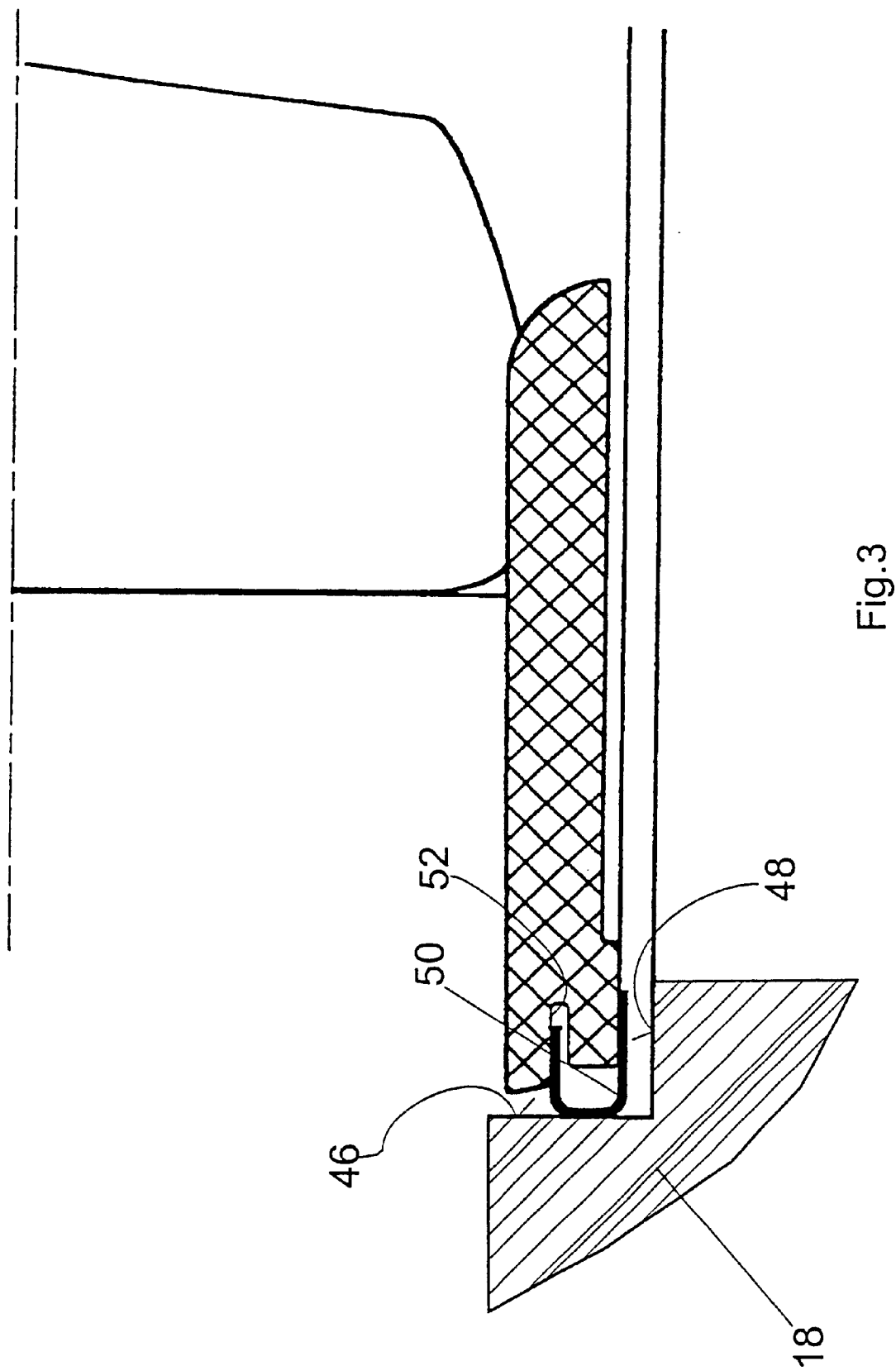
FIG. 3 shows a model system to which an embodiment of the present invention is applied.

The performance of the proposed method was evaluated for a-phase to ground faults on a 154 kV, 200 km overhead transmission line as shown in FIG. 3. The overhead transmission line parameters used in the simulations are given in Table I. The EMTP was used to generate fault current signals under different fault locations and fault inception angles. The sampling frequency was set to 7680 Hz: 128 samples per cycle in a 60 Hz system. The EMTP output was pre-conditioned by a second order Butterworth low-pass filter with a cutoff frequency of 600 Hz in order to reject high frequency components and prevent aliasing errors. The a14 g faults incepted at four different angles (−15°, 15°, 45°, and 75°) were considered at 30 km (FIG. 4a) and 180 km (FIG. 4b) of the fault distances from a relaying point, where the zero crossing of a-phase voltage signal was chosen as reference angle.

TABLE I

OVERHEAD TRANSMISSION LINE PARAMETERS

| Sequence | Parameter | Value | Unit |
|---|---|---|---|
| Positive | $R_1, R_2$ | 0.1006 | Ω/km |
| Negative | $L_1, L_2$ | 1.2380 | mH/km |
|  | $C_1, C_2$ | 0.0093 | μF/km |
| Zero | $R_0$ | 0.3088 | Ω/km |
|  | $L_0$ | 3.4732 | mH/km |
|  | $C_0$ | 0.0038 | μF/km |

Figure 4A:
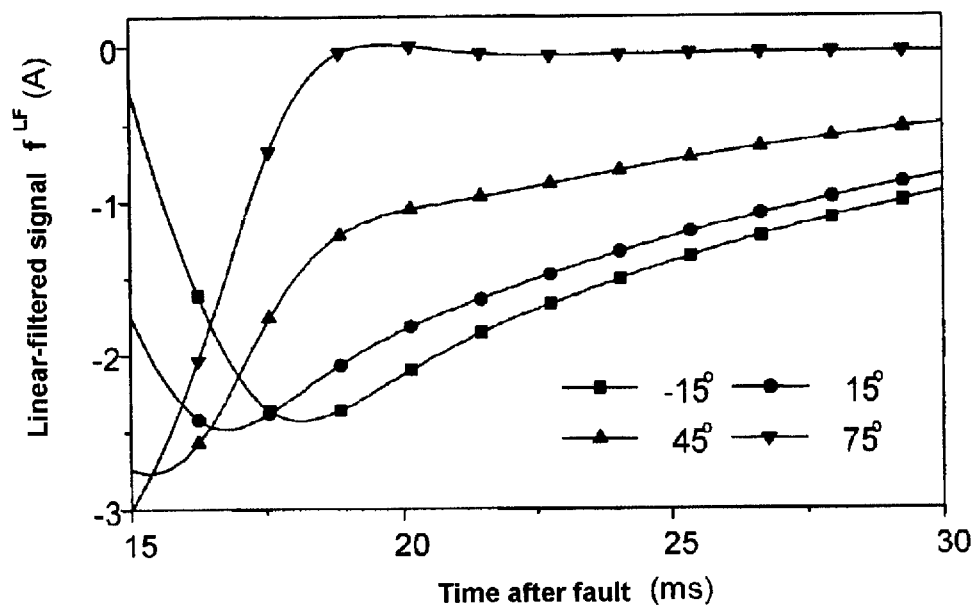
FIG. 4 shows the effect of fault locations (30 km and 180 km) and fault inception angles (−15°, 15°, 45°, 75°) on the linear-filtered signal $f^{LF}$.
Figure 4B:
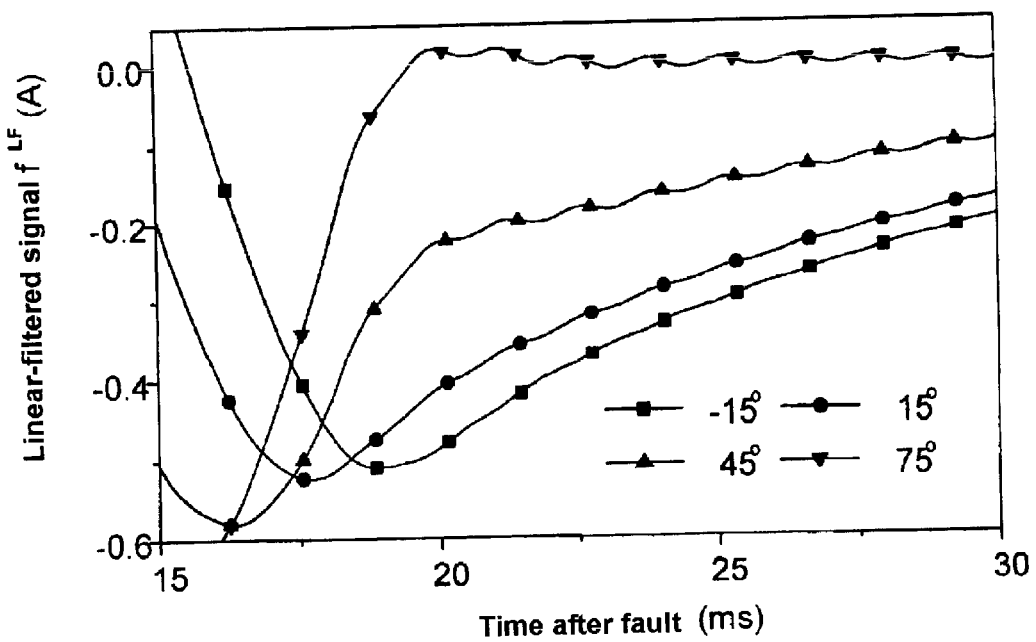

As shown in FIG. 4a, in the case of a 30 km a–g fault, the characteristic frequency component contained in $f^{LF}$ has very small amplitude because this component was almost completely removed by the low-pass filter. On the other hand, in the case of a 180 km a–g fault (FIG. 4b), the characteristic frequency contained in $f^{LF}$ has considerable amplitude compared to the DC-offset; particularly, when the fault inception angle is close to 75°. This is because the characteristic frequency, about 710 Hz, of the 180 km a–g fault is not so high compared to the cut-off frequency, 600 Hz, of the low-pass filter. Consequently, the characteristic frequency component passes the low-pass filter and causes ripples on the linear filtered signal.

Figure 5:
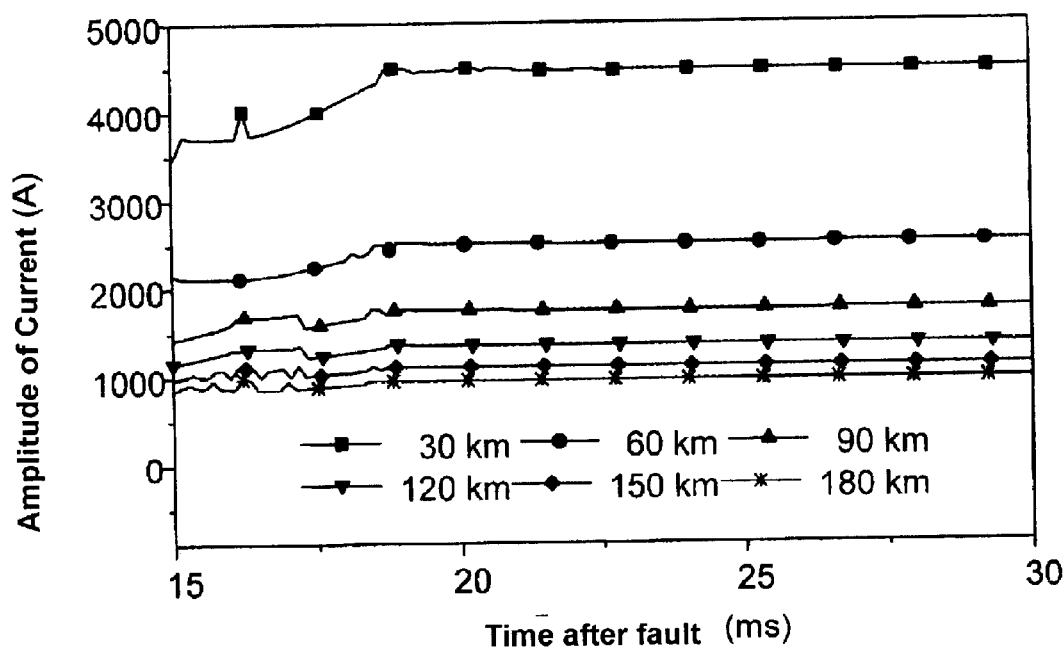
FIG. 5 shows time responses for a-phase to ground faults at 15° of the fault inception angle, and at 30 km, 60 km, 90 km, 120 km, 150 km and 180 km of fault locations, which are obtained by applying a method of the present invention.
Figure 1:
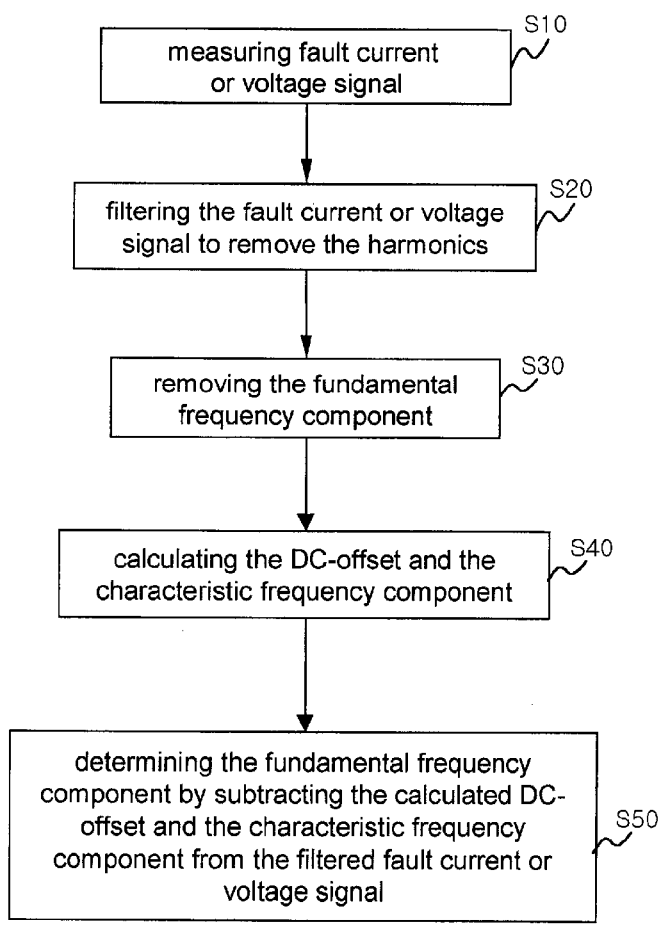
Figure 3:
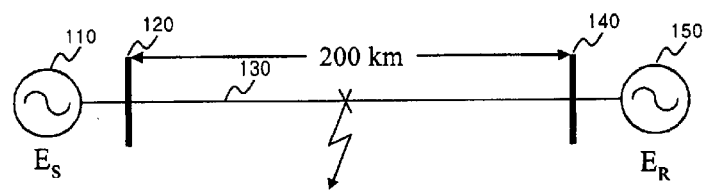

FIG. 5 shows time responses for a-phase to ground faults at 15° of the fault inception angle, and at 30 km, 60 km, 90 km, 120 km, 150 km and 180 km of fault locations, which are obtained by applying a method of the present invention. The actual and estimated amplitudes of fault current signals have almost equal values. Convergence time is used as a performance index, which is defined as the amount of time required for the estimated amplitude to stay within ±5% of the actual amplitude in post-fault steady state. When the method according to the present invention is applied to the detection of a fault current or voltage signal, the convergence time is below 20 ms, providing fast and accurate detection of a fault current or voltage.

To one skilled in the art, mathematical modifications to the equations disclosed in the embodiments is minor modifications of the present invention, and therefore does not exceed the technical concept of the present invention. For example, the order of the steps in the embodiment can be modified without departing the technical scope of the present invention.

The objective of the embodiments and drawings is to clearly explain the present invention and does not limit the technical concept of the invention. The present invention described above can be replaced, modified and changed by one skilled in the art, as long as such changes do not exceed the technical scope of the invention. Therefore, the invention is not limited by the embodiments and drawings; and the claims should be included in consideration of the invention.

What is claimed is:

1. A method for measuring the fundamental frequency component of a fault current or voltage, comprising the steps of:

measuring a fault current or voltage signal, which includes a DC-offset, a characteristic frequency component, a fundamental frequency component, and harmonics, with a predetermined sampling period;

filtering the fault current or voltage signal to remove the harmonics;

removing the fundamental frequency component from the filtered fault current or voltage signal;

calculating the DC-offset and the characteristic frequency component with the fault current or voltage signal wherein the fundamental frequency component is removed; and determining the fundamental frequency component by subtracting the calculated DC-offset and characteristic frequency component from the filtered fault current or voltage signal.

2. The method according to claim 1, wherein, in the step of filtering the fault current or voltage signal to remove the harmonics, the sine filter is used.

3. The method according to claim 1, wherein, in the step of removing the fundamental frequency component, the linear filter is used.

4. The method according to claim 1, wherein, in the step of calculating the DC-offset and the characteristic frequency component, Prony's method is used.

* * * * *

UNITED STATES PATENT AND TRADEMARK OFFICE
CERTIFICATE OF CORRECTION

PATENT NO.     : 6,597,160 B2
DATED          : July 22, 2003
INVENTOR(S)    : Soon Yeol Nam et al.

It is certified that error appears in the above-identified patent and that said Letters Patent is hereby corrected as shown below:

Title page,
Item [75], please correct the Inventor's name from "Soon yeol Nam" to
-- Soon Yeol Nam --.

Drawings,
Figs. 1 and 3 are incorrect. Please insert as-filed Figs. 1 and 3.

Signed and Sealed this

Fourteenth Day of October, 2003

JAMES E. ROGAN
*Director of the United States Patent and Trademark Office*